United States Patent
Peng et al.

(10) Patent No.: US 12,046,493 B2
(45) Date of Patent: Jul. 23, 2024

(54) METHOD FOR DETERMINING A SUBSTRATE POSITION IN A CLOSED CHAMBER AND APPARATUS FOR PERFORMING THE METHOD

(71) Applicants: China Triumph International Engineering Co., Ltd., Shanghai (CN); CTF Solar GmbH, Dresden (DE)

(72) Inventors: Shou Peng, Shanghai (CN); Michael Harr, Dresden (DE); Xinjian Yin, Shanghai (CN); Ganhua Fu, Dresden (DE); Christian Kraft, Dresden (DE); Stefan Rau, Dresden (DE); Bastian Siepchen, Dresden (DE)

(73) Assignees: China Thumph International Engineering Co., Ltd., Shanghai (CN); CTF Solar GmbH, Dresden (DE)

( * ) Notice: Subject to any disclaimer, the term of this patent is extended or adjusted under 35 U.S.C. 154(b) by 1088 days.

(21) Appl. No.: 16/768,704

(22) PCT Filed: Nov. 30, 2017

(86) PCT No.: PCT/CN2017/113973
§ 371 (c)(1),
(2) Date: Jun. 1, 2020

(87) PCT Pub. No.: WO2019/104648
PCT Pub. Date: Jun. 6, 2019

(65) Prior Publication Data
US 2021/0013072 A1 Jan. 14, 2021

(51) Int. Cl.
*B65G 13/075* (2006.01)
*H01L 21/67* (2006.01)
(Continued)

(52) U.S. Cl.
CPC .. *H01L 21/67265* (2013.01); *H01L 21/67253* (2013.01); *H01L 21/67259* (2013.01);
(Continued)

(58) Field of Classification Search
CPC .............. B65G 47/2445; B65G 13/075; B65G 47/261; B65G 49/064; C03B 35/147; H01L 21/67259; H01L 21/67253
See application file for complete search history.

(56) References Cited

U.S. PATENT DOCUMENTS 5,906,268 A * 5/1999 Kalm ................... B65G 47/261
  198/781.01
9,151,597 B2 * 10/2015 Milliron ............ H01L 21/67259

* cited by examiner

*Primary Examiner* — Lam S Nguyen
(74) *Attorney, Agent, or Firm* — IPRTOP LLC

(57) ABSTRACT

The present invention relates to a method and an apparatus for determining the position of a substrate within a closed chamber, wherein the substrate is moved within the chamber by a transport system comprising at least one rotating shaft. A load-converting element is provided adjacent to at least one of the rotating shafts, wherein the load-converting element detects a load acting on the at least one rotating shaft and converts it into an electrical parameter. While no substrate is present on the at least one rotating shaft, a first output signal corresponding to a first value of the electrical parameter is measured. The output signal is then monitored and a presence of the substrate on the at least one rotating shaft is detected when the output signal differs from the first output signal by at least a predetermined amount.

15 Claims, 8 Drawing Sheets

Figure 1:
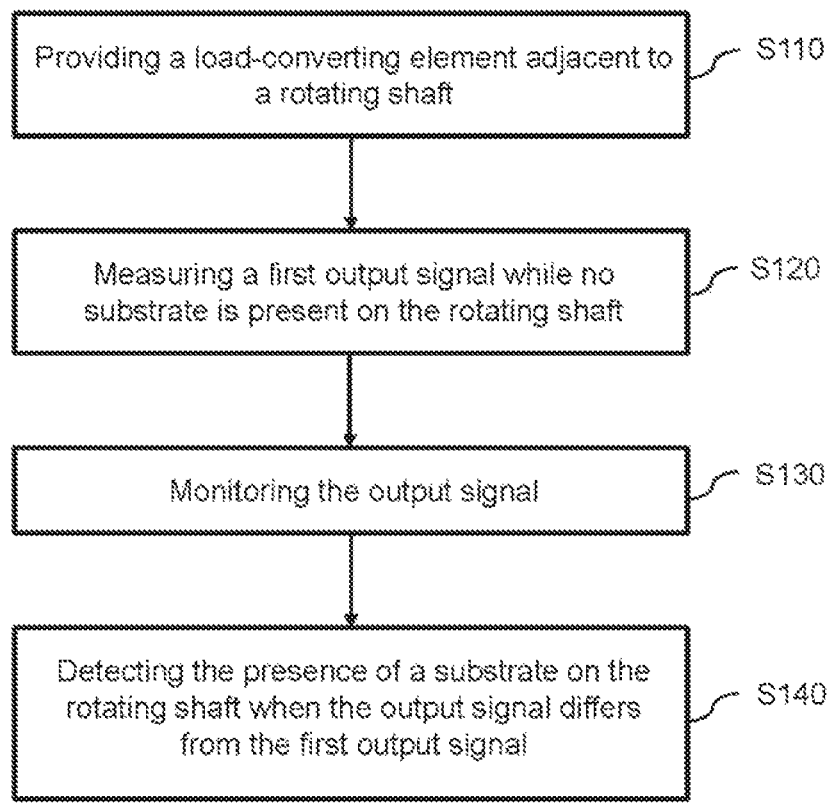

(51) Int. Cl.
*H01L 21/677* (2006.01)
*B65G 49/06* (2006.01)
(52) U.S. Cl.
CPC .. *H01L 21/67288* (2013.01); *H01L 21/67706* (2013.01); *H01L 21/6776* (2013.01); *B65G 49/064* (2013.01); *B65G 2203/0233* (2013.01); *B65G 2203/0275* (2013.01)

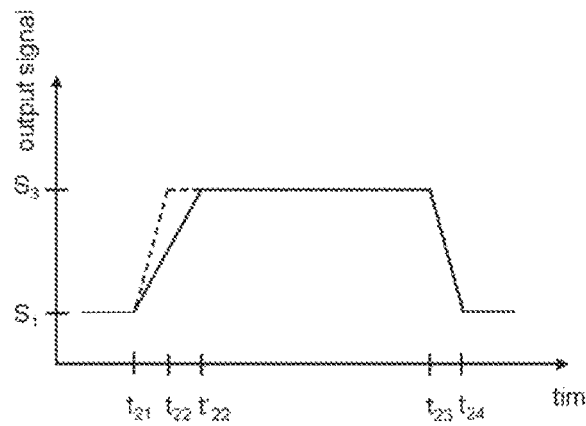
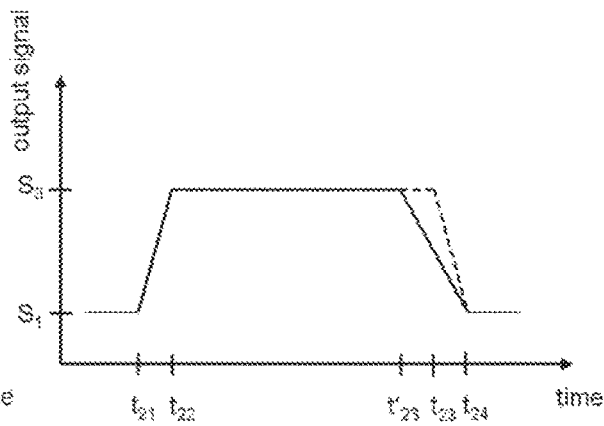
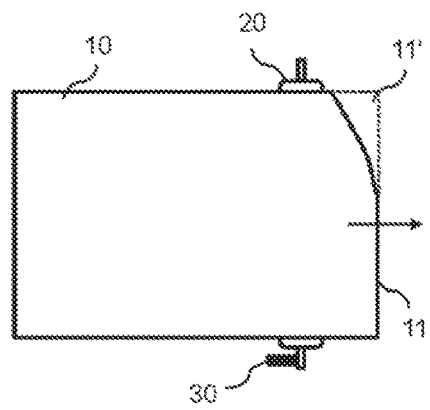
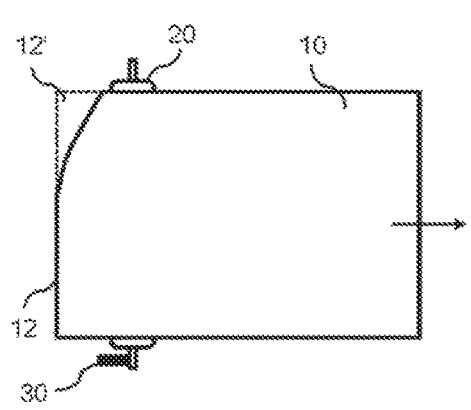
Fig. 3B                    Fig. 3C

METHOD FOR DETERMINING A SUBSTRATE POSITION IN A CLOSED CHAMBER AND APPARATUS FOR PERFORMING THE METHOD

The present invention refers to a method for determining a position of a substrate within a closed chamber of a device for processing the substrate and an apparatus for performing this method. Particularly, the invention refers to determining a position of a substrate which is moved within or through a chamber, which is closed on all sides and may be a vacuum chamber.

In many production processes, especially with respect to large, plane substrates, the substrates to be processed are moved within or through a chamber of a production line, in particular of an in-line system. Such substrates may be used for producing photoelectric devices, e.g. a solar cell or a photosensor, or light-emitting devices, e.g. a light-emitting diode, or light-transmitting devices, e.g. a liquid-crystal display or a touch screen, or other devices. Often, a substrate is moved using means like rollers or shafts or belts. Further, some of the processes performed are vacuum processes, and the chambers used may be hermetically, i.e. gastight, closed on all sides, for instances by locks or gates. Even if the chamber is not closed on all sides, but has small openings for inserting and removing substrates into or from it, respectively, a simple determination of a position of a substrate within the chamber by eye-minded control from outside the chamber may not be possible. Therefore, the position of the substrate is often extrapolated from the movement of the moving means or determined using optical or thermal sensors within the chamber according to the state of the art.

However, extrapolation does not allow determination of the position as precise as needed and completely fails when the movement of the substrate is somehow disturbed, for instance due to slippage of the substrate or due to a broken or otherwise damaged substrate. Optical sensors may often not be used due to vapor (e.g. in evaporation processes) or plasma in plasma processes or simply due to insufficient space or visual axis within the chamber. Thermal sensors often do not possess the needed spatial resolution. If sensors are installed within the chamber, they suffer from high stress due to the processes performed within the chamber, e.g. from high temperatures during evaporation processes. Even if sensors are installed outside the chamber, as described for instance in US 2013/0206065 A1, a window for the sensors within the chamber wall is necessary resulting in a complicated construction of the chamber and further reduction of the sensor resolution and the accuracy of the determination. Further, it is very difficult to detect local damages of the substrate, e.g. broken substrates.

The object of the present invention is to provide a method for determining a position of a substrate within a closed chamber with high accuracy of determination and which prevents at least some of the disadvantages of the methods according to the state of the art. A further object is to provide an apparatus for performing the method.

These objects are solved by the method and the apparatus, respectively, according to the independent claims. Embodiments are given in the dependent claims.

According to the invention, a method for determining the position of a substrate within a closed chamber comprises the steps of providing a load-converting element adjacent to at least one of rotating shafts being part of a transport system on which the substrate is moved within the chamber, measuring a first output signal of the load-converting element while no substrate is present on the at least one rotating shaft, monitoring the output signal of the load-converting element and detecting a presence of the substrate on the at least one rotating shaft when the output signal of the load-converting element differs from the first output signal by at least a predetermined amount.

The transport system may comprise a plurality of rotating shafts arranged within the closed chamber, wherein the substrate is directly moved over the rotating shafts, or may comprise at least one belt, e.g. conveyer belt, which moves through the closed chamber and is supported by at least one rotating shaft within the chamber, wherein the substrate is indirectly moved over the rotating shaft while lying on the belt. The substrate may be transported continuously, discontinuously, i.e. with stops, e.g., to perform a processing step, or oscillating, i.e. bidirectional or back and forth for one or more times.

The closed chamber may be any kind of vacuum or atmospheric chamber in which any kind of atmosphere, e.g. reactive, corrosive or misty (foggy) atmosphere may be present while the method is performed. The chamber may be hermetically, i.e. gastight, closed on all sides, for instances by locks or gates, or may have openings for inserting and removing substrates into or from it, respectively. However, a simple determination of a position of a substrate within the chamber by eye-minded control from outside the chamber is not possible, and therefore the chamber is called a closed chamber. Furthermore or alternatively, the inside of the closed chamber may be heated to temperatures above 300° C., above 400° C., above 500° C. or even above 550° C., while the method is performed. For such high temperatures, other methods for determining the position of the substrate using optical or thermal sensors according to the prior art often cannot be applied. The process performed within the closed chamber and acting on the substrate may be any kind of process, e.g. temperature treatment processes like annealing, evaporation processes like CSS (closed space sublimation), other deposition processes like CVD (chemical vapor deposition), PVD (physical vapor deposition) or structuring processes like dry etching. That is, the substrate may be temperature treated or a layer may be deposited on or removed from the substrate while the substrate is situated within the chamber, for instance a closed space sublimation process may be performed.

The load-converting element is suited for detecting a load acting on the rotating shaft and converting it into a value of an electrical parameter corresponding to the load. The value of the electrical parameter can be determined by measuring an electric output signal corresponding to the electrical parameter. The load-converting element may be a piezoelectric element which comprises a piezoelectric material and two electrodes arranged on the piezoelectric material. The piezoelectric material converts the load into an electrical charge resulting in a voltage between the electrodes. The voltage can then be measured by a measuring device as an output signal. In another embodiment, the load-converting element is a strain gauge which is a resistor whose resistance changes if the resistor is stretched or compressed. The resistance, which is the electric parameter to which the load is converted, can be determined by measuring an electric current for a given voltage applied to the resistor, wherein the electric current is the output signal of the strain gauge which can be measured by a measuring device. Alternatively, the voltage may be measured for a given electric current. "Adjacent to a rotating shaft" means that the load-converting element is arranged such that it directly or indirectly adjoins the rotating shaft and such that a load acting on the rotating shaft also directly or indirectly acts on the load-converting element. That is, the load-converting element may be arranged directly on the surface of the rotating shaft, for instance in the case of a strain gauge, or may be arranged adjoining a bearing which directly adjoins and holds the rotating shaft, for instance in the case of a piezoelectric element.

The predetermined amount, by which the output signal has to differ in order to detect a presence of the substrate, is chosen such that noise of the output signal is not detected as a signal corresponding to the presence of the substrate by mistake. By way of example, piezoelectric elements are very sensitive and low-noise devices, and therefore even the presence or absence of lightweight substrates may be detected. For instance, a change in load by 0.5 mN may be detected. Also strain gauges provide a good signal-to-noise ratio.

Detecting a presence of a substrate by the method according to the invention corresponds to determining the position of the substrate within the closed chamber since the position of the rotating shaft is known within the chamber. Thus, a change of the output signal from the first output signal to a value which differs from the first output signal by the predetermined amount corresponds to a position of the substrate in which a front edge of the substrate is at the position of the rotating shaft. If the output signal has a value which differs from the first output signal by the predetermined amount corresponds to a position of the substrate in which the substrate covers an area within the chamber which contains the position of rotating shaft. And a change of the output signal from a value which differs from the first output signal by the predetermined amount to the first output signal corresponds to a position of the substrate in which a back edge of the substrate is at the position of the rotating shaft.

"Rotating shaft" means each rotating structure at a whole which is stationary arranged within the chamber and suited for rotating and holding a substrate directly or indirectly while the substrate moves over it. In this respect, "directly holding a substrate" means that the substrate or a substrate carrier, in which the substrate is held, directly lies on the rotating shaft with one of its surfaces, whereas "indirectly holding a substrate" means that the substrate or a substrate carrier lies with one of its surfaces on at least one belt which is in turn held by the rotating shaft. In the last case, the substrate itself is moved through the chamber by the belt, wherein the belt is at least supported by the rotating shaft within the chamber. In any way, the rotating shaft may be driven by a motor to rotate, i.e. may actively participate in transporting the substrate through the chamber, or may be rotated only passively by the substrate or the belt moving over it. The rotating shaft may comprise different components, for instance a substrate shaft on which the substrate directly or indirectly lies upon and a driving shaft passing through a chamber wall and being connected with the substrate shaft by a shaft coupling. Moreover, further elements may be comprised by the rotating shaft. By way of example, rollers may be formed or arranged on the substrate shaft, wherein the substrate directly or indirectly rests on the rollers.

"Measuring" means determining the actual value of the output signal at a given point of time. "Monitoring" means determining and observing the value of the output signal over time thereby allowing for comparing different values and detecting changes in the value of the output signal and for obtaining characteristics of the output signal over time.

In an embodiment, a first point of time at which the substrate should be present on the rotating shaft is predicted by extrapolation using a known position of the substrate, e.g. outside the closed chamber, and characteristics of a moving system which moves the substrate from the known position to the rotating shaft. The moving system may be formed similar to the transport system or may be formed in another way. For instance, the moving system may comprise a conveyor belt, whereas the transport system comprises only rotating shafts, or vice versa. It is also possible, that the moving system comprises any other moving components, for instance a robot system feeding the substrate to the transport system. Depending on the position of the rotating shaft used for detecting the position of the substrate within the chamber and of the kind of the transport system and the moving system, the moving system may be identic to the transport system, i.e. is the transport system, or may comprise the transport system among other moving components or may be completely separated from the transport system. If the substrate is not detected at the first point of time using the output signal of the load-converting element, damage or a loss of the substrate or a disturbance in the movement of the substrate is detected. That is, an absence of an output signal corresponding to the presence of the substrate at the first point of time may be caused by a damage of the substrate, e.g. a broken front edge of the substrate, or by a total loss of the substrate or by a defect of the moving system. A damaged substrate or a retarded movement of the substrate would result in a delayed detection of an output signal by a specific time period. A total loss of the substrate, e.g. due to falling down of the substrate from the moving system, or a total failure of the moving system would result in no detection of an output signal corresponding to the presence of the substrate at all. In this case, a visual inspection of the closed chamber, for instance by opening the chamber, may be necessary.

In another embodiment, not only a change of the output signal is observed, but characteristics of the output signal if a substrate moves over the rotating shaft are obtained and evaluated for determining further features of the substrate. To this end, first characteristics of the output signal, i.e. a progression of the output signal over time, are obtained for a known calibration substrate. That is, the first characteristics are used for calibration of the output signal. The first characteristics contain a first gradient of the output signal corresponding to the arrival of the calibration substrate at the rotating shaft, a second gradient of the output signal corresponding to the calibration substrate leaving the rotating shaft and a maximum value corresponding to the complete covering of the rotating shaft by the substrate. For substrates, which are plate-like and essentially rectangular, the output signal equals the maximum value for essentially the whole time while the substrate covers the rotating shaft. The calibration substrate is a substrate which has the same dimensions and characteristics as other substrates which position should be observed, wherein the calibration substrate is known to have no damage. It is moved the same way as the other substrates through the closed chamber.

If such first characteristics are obtained, a damage of the substrate at its front edge is detected, if a first gradient of second characteristics of the output signal monitored while the substrate completely moves over the rotating shaft differs from the first gradient of the first characteristics. The front edge of the substrate is that edge which arrives at the rotating shaft first, i.e. the leading edge in transport direction. If the front edge is damaged, for instance if a part of the front edge is missing, the first gradient of the output signal is lower than the first gradient of the first characteristics. If, however, the front edge of the substrate is broken parallel to the previous undamaged front edge, the damage may not be detected using the first gradient.

On the other hand, a damage of the substrate at its back edge is detected if a second gradient of second characteristics of the output signal monitored while the substrate completely moves over the rotating shaft differs from the second gradient of the first characteristics. The back edge of the substrate is that edge which leaves the rotating shaft last, i.e. the rear edge in transport direction. If the back edge is damaged, for instance if a part of the back edge is missing, the second gradient of the output signal is lower than the second gradient of the first characteristics. Again, if the back edge is broken parallel to the previous undamaged back edge, the damage may not be detected using the second gradient.

Further, a damage of the substrate at a side edge or on a first surface is detected if a maximum value of second characteristics of the output signal monitored while the substrate completely moves over the rotating shaft is lower than the maximum value of the first characteristics. A side edge of the substrate is an edge which connects the front edge and the back edge of the substrate, whereas a first surface of the substrate may be a surface of a plate-like substrate on which the substrate rests on the rotating shafts or a surface which is opposite to the rotating shafts.

The maximum value of the obtained second characteristics may also be lower than the maximum value of the first characteristics if a layer formed on or at the substrate within the closed chamber has a lower thickness than that of the calibration substrate. That is, it is possible to detect a deteriorated process of forming the layer and to counteract this malfunction, for instance by reducing the velocity of movement of the substrate through the chamber.

In another embodiment, a plurality of load-converting elements is provided adjacent to a plurality of rotating shafts, wherein each load-converting element is suited for detecting a load acting on one of the rotating shafts. An output signal of each load-converting element is measured at one and the same point of time while the substrate is present on at least some of the rotating shafts. Using the measured output signals, a weight or dimensions of the substrate are determined using calculation procedures apparent to a person skilled in the art.

In one embodiment, the load-converting element is arranged within a radial bearing holding the rotating shaft. A wear of the bearing is detected if the output signal shows a linear or superlinear drift over a time period including a large plurality of passages of essentially equal substrates over the rotating shaft. A superlinear drift describes a function of the output signal over time that eventually grows faster than any linear function. Since output signals resulting from the passing substrate appear periodic, e.g. once per minute, a long-term drift can be recognized and separated from the output signals resulting from substrate passages without any problem.

The method according to the invention provides a simple possibility to determine the position of a substrate within a closed chamber with a high spatial resolution and also under conditions where other methods using optical or thermal sensors may not be used. Further, also damages of the substrate may be detected and a deposition or removing process may be controlled with respect to the thickness of a layer deposited on or removed from the substrate within the closed chamber. Moreover, the used load-converting elements show low noise, high sensibility and a high linearity of the output signal from the load. Piezoelectric elements have further advantages. In particular they do not need an external voltage supply and are wear-less.

According to another aspect of the invention, an apparatus for performing the inventive method comprises a closed chamber with a transport system comprising at least one rotating shaft, a load-converting element arranged adjacent to at least one of the rotating shafts, a measuring device for measuring an output signal of the load-converting element and a control device for monitoring and evaluating the measured output signal and detecting a presence of a substrate on the at least one rotating shaft. The transport system is suited for moving a substrate through and/or within the chamber and may comprise a plurality of rotating shafts arranged within the closed chamber, wherein the substrate is directly moved over the rotating shafts, or may comprise at least one belt, e.g. conveyer belt, which moves through the closed chamber and is supported by at least one rotating shaft within the chamber, wherein the substrate is indirectly moved over the rotating shaft while lying on the belt. The load-converting element is suited for detecting a load acting on the at least one rotating shaft adjacent to which it is arranged. The load-converting element converts the load into a value of an electrical parameter corresponding to the load. The value of the electrical parameter can be determined by measuring an electric output signal corresponding to the electrical parameter using the measuring device. The measuring device is used to obtain a first output signal which is measured while no substrate is present on the at least one rotating shaft. The control device is suited for monitoring the measured output signal and detecting the presence of a substrate on the rotating shaft, when the output signal differs from the first output signal by a predetermined amount. The control device may, for instance, be a computer. However, the measuring device and the control device may also be formed as one, integral device suited for performing the functions of both devices.

In one embodiment, the at least one rotating shaft of the apparatus is held by a radial bearing arranged within a chamber wall and the load-converting element is arranged within the bearing. In this case, the load-converting element is protected from external influences, for instance vapor or other aggressive media or high temperatures within the chamber. Further, a strain caused by a load on the rotating shaft is easy to detect within the bearing. The output signal of the load-converting element may be transmitted via wires and a vacuum feedthrough to the measuring device.

However, the load-converting element may be arranged at any place where a deformation or strain of the rotating shaft caused by the load of the substrate occurs and can be measured.

In another embodiment, the apparatus comprises a plurality of rotating shafts and a plurality of load-converting elements, wherein each load-converting element is arranged adjacent to a specific one of the rotating shafts and the control device is suited for evaluating the output signals of all of the load-converting elements and for determining a weight or dimensions of the substrate being present on the rotating shafts.

The load-converting element may be a piezoelectric element or a strain gauge or any other suitable element.

The apparatus according to the invention may be a part of an inline system, in which substrates are processed while they are moved through the system along a linear line by the transport system. The transport system may comprise a plurality of rotating shafts arranged within the closed chamber, wherein the substrate is directly moved over the rotating shafts, or may comprise at least one belt, e.g. conveyer belt, which moves through the closed chamber and is supported by at least one rotating shaft within the chamber, wherein the substrate is indirectly moved over the rotating shaft while lying on the belt. The transport system may be suited to transport a substrate continuously, discontinuously, i.e. with stops, e.g., to perform a processing step, or oscillating, i.e. bidirectional or back and forth for one or more times.

The closed chamber may be any kind of vacuum or atmospheric chamber as described above. In one embodiment, the closed chamber is a vacuum chamber, and may be in particular a CSS chamber used for closed space sublimation (CSS), for instance of CdTe or CdS in order to produce thin film solar cells.

FIGURES

The accompanying drawings are included to provide a further understanding of embodiments of the invention and are incorporated in and constitute a part of this specification. The drawings illustrate some embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 schematically shows a first embodiment of the method of the invention, wherein the presence or absence of a substrate on one rotating shaft is detected.

Figure 2A:
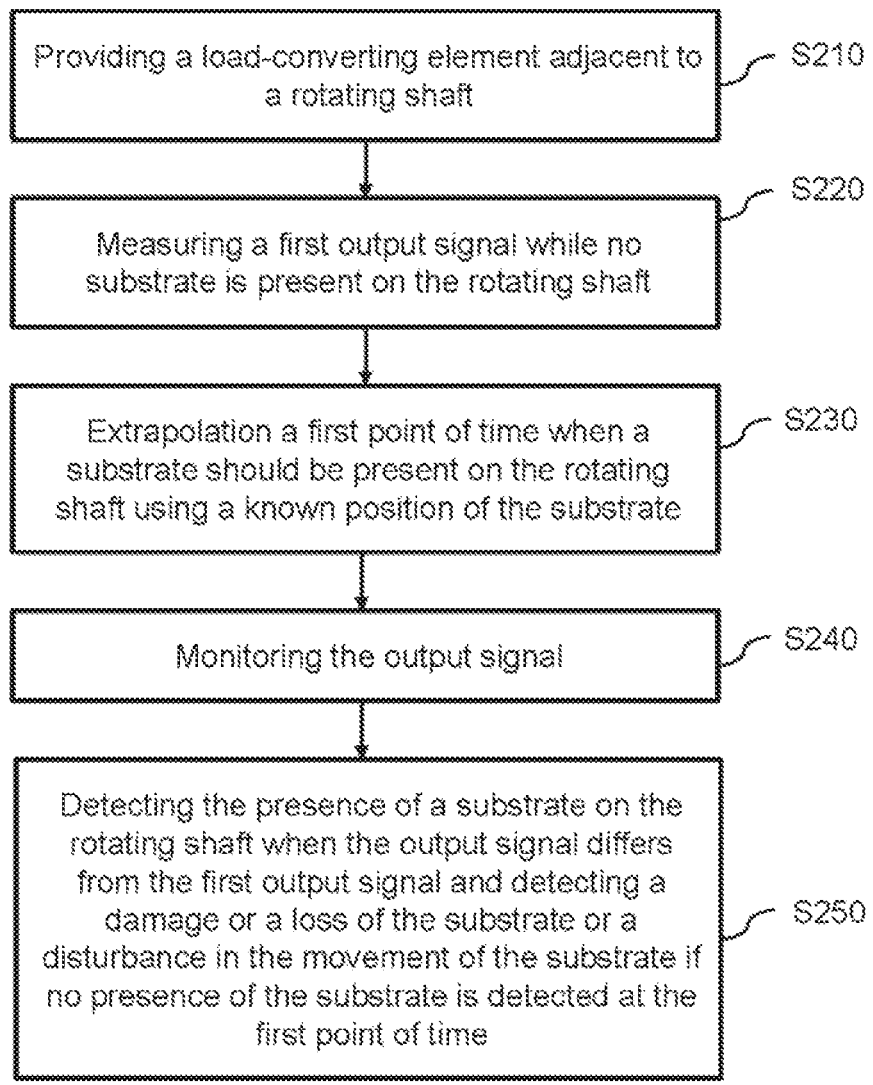

FIG. 2A schematically shows a second embodiment of the method of the invention, wherein a damage or a loss of the substrate or a disturbance in the movement of the substrate may be detected.

Figure 2B:
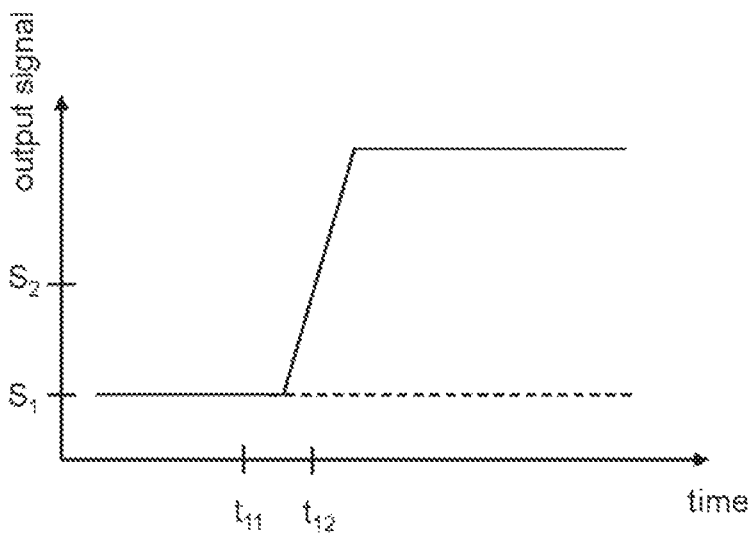

FIG. 2B schematically shows two characteristics of the output signal over time according to the second embodiment of the method.

Figure 3A:
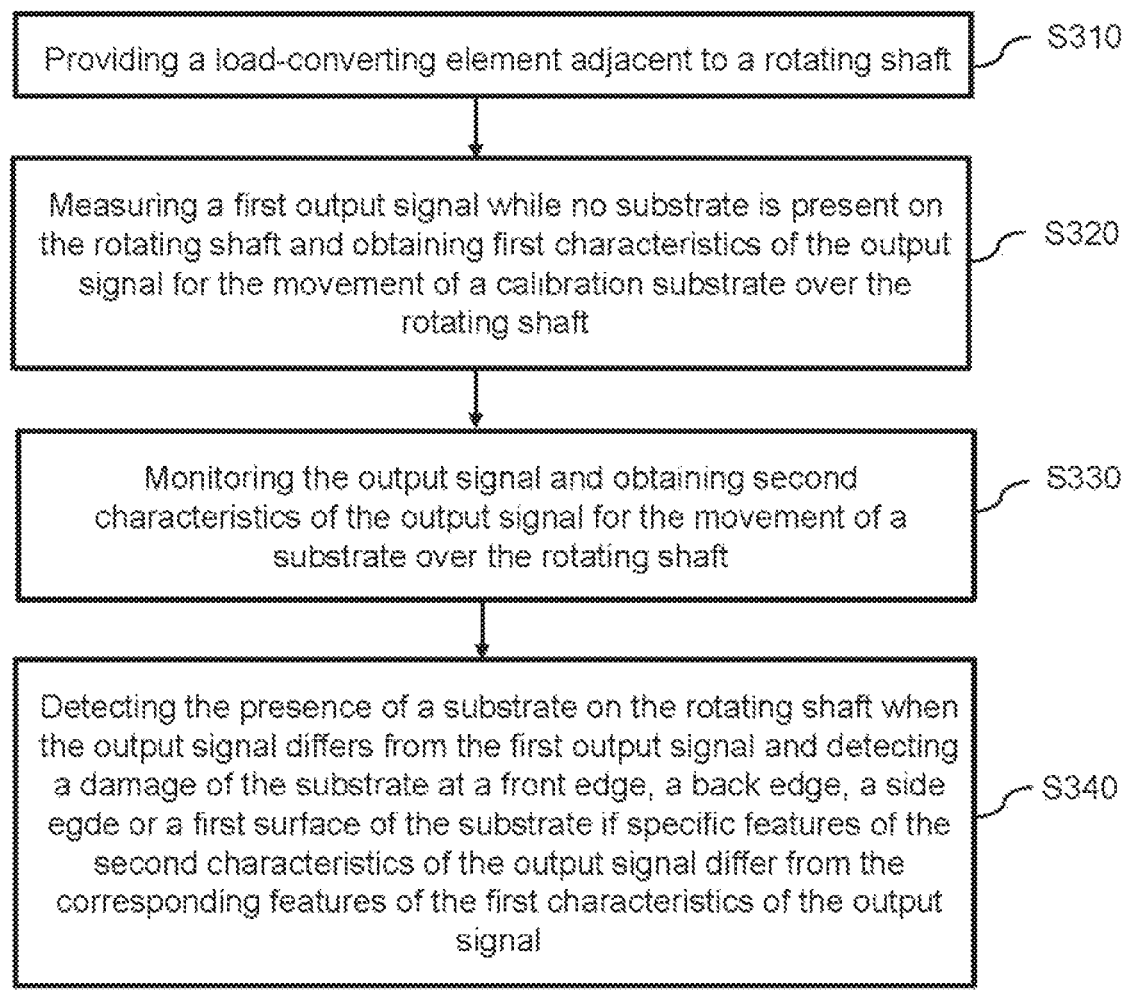

FIG. 3A schematically shows a third embodiment of the method of the invention, wherein a damage of the substrate may be detected.

Figure 3D:
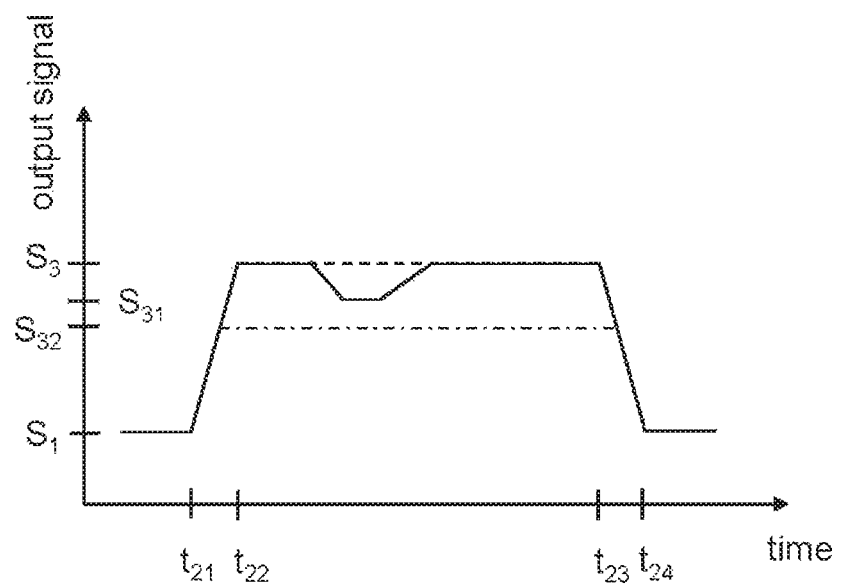
Figure 3D:
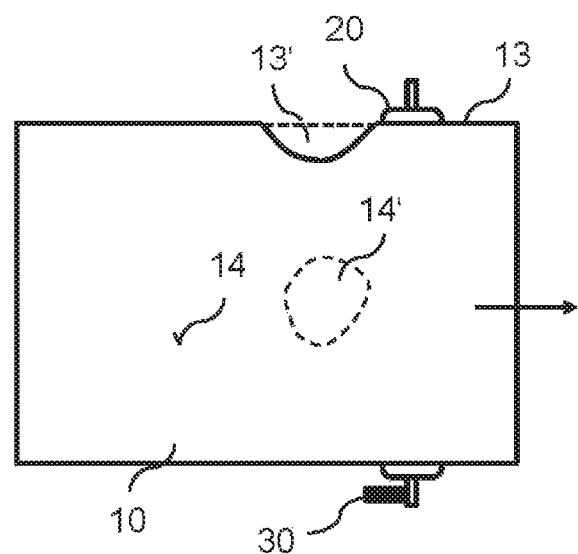

FIGS. 3B to 3D each schematically show characteristics of the output signal over time according to the third embodiment of the method.

Figure 4A:
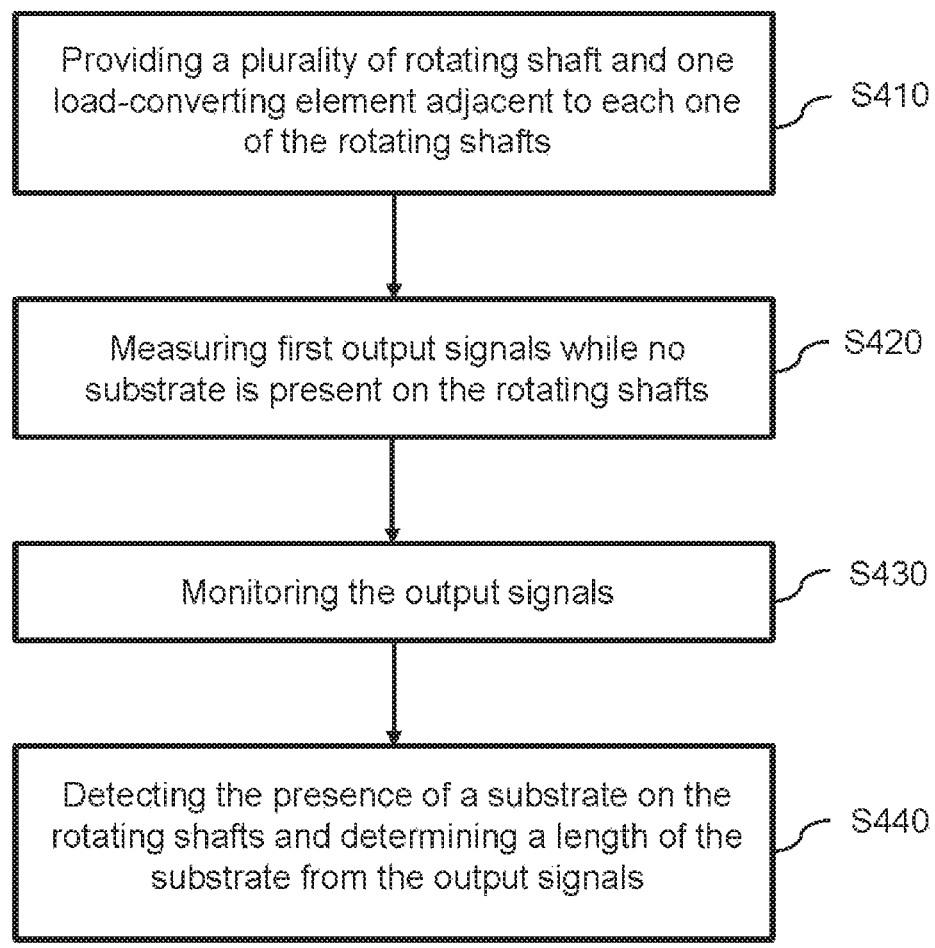

FIG. 4A schematically shows a fourth embodiment of the method of the invention, wherein a dimension of a substrate may be determined using a plurality of load-converting elements.

Figure 4B:
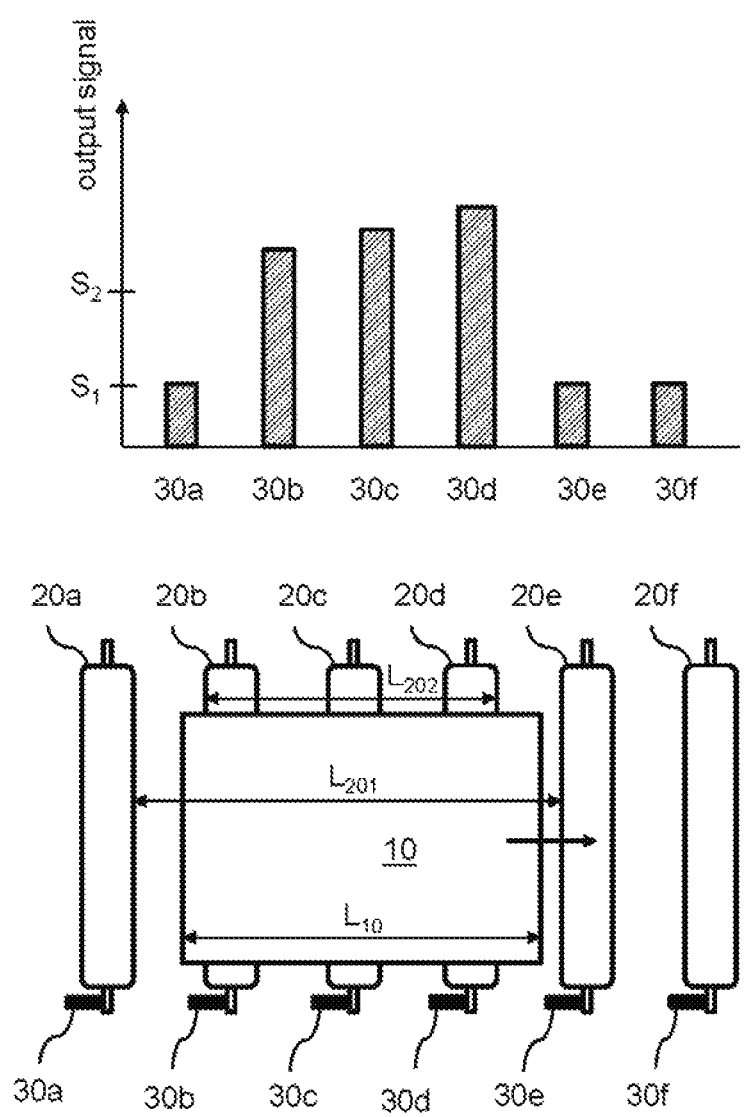

FIG. 4B schematically shows values of the output signals for different load-converting elements according to the fourth embodiment of the method.

Figure 5:
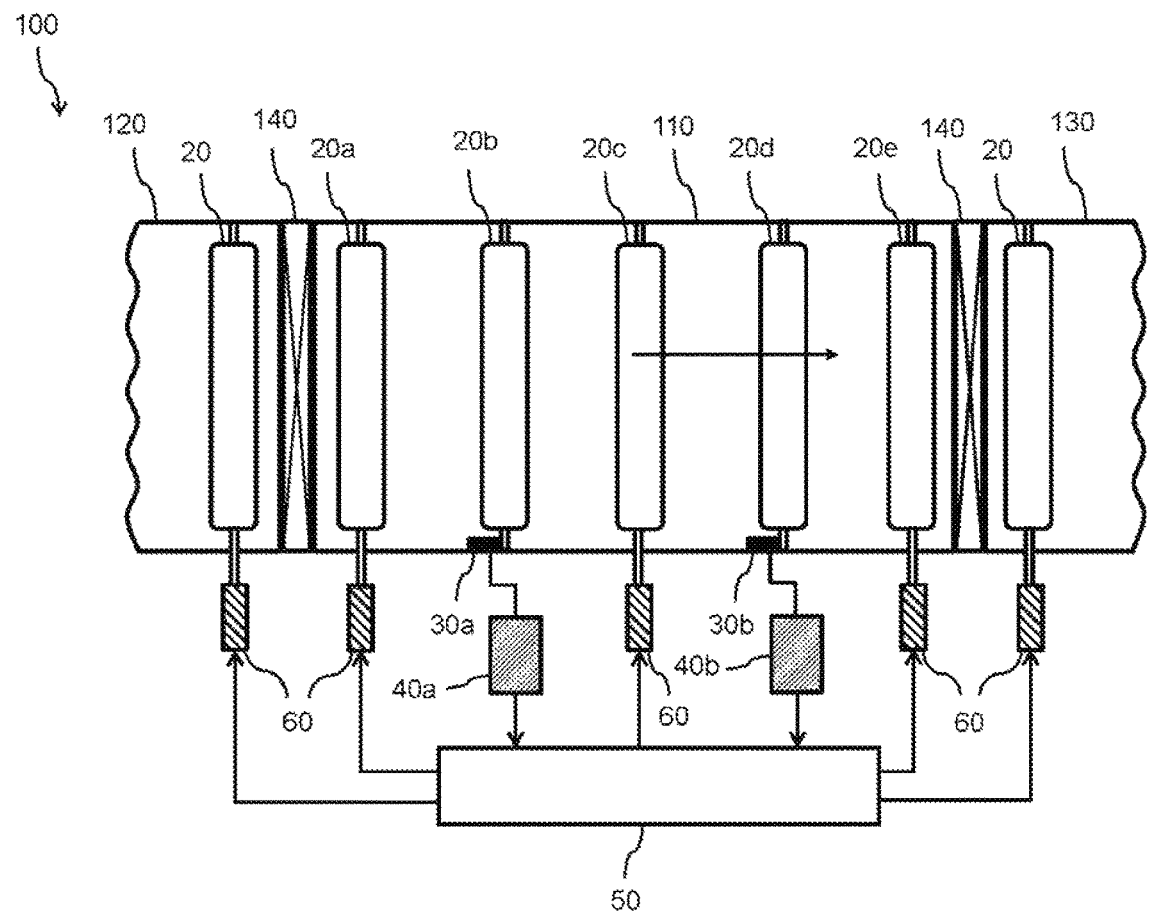

FIG. 5 schematically shows a first embodiment of the apparatus according to the invention.

Figure 6:
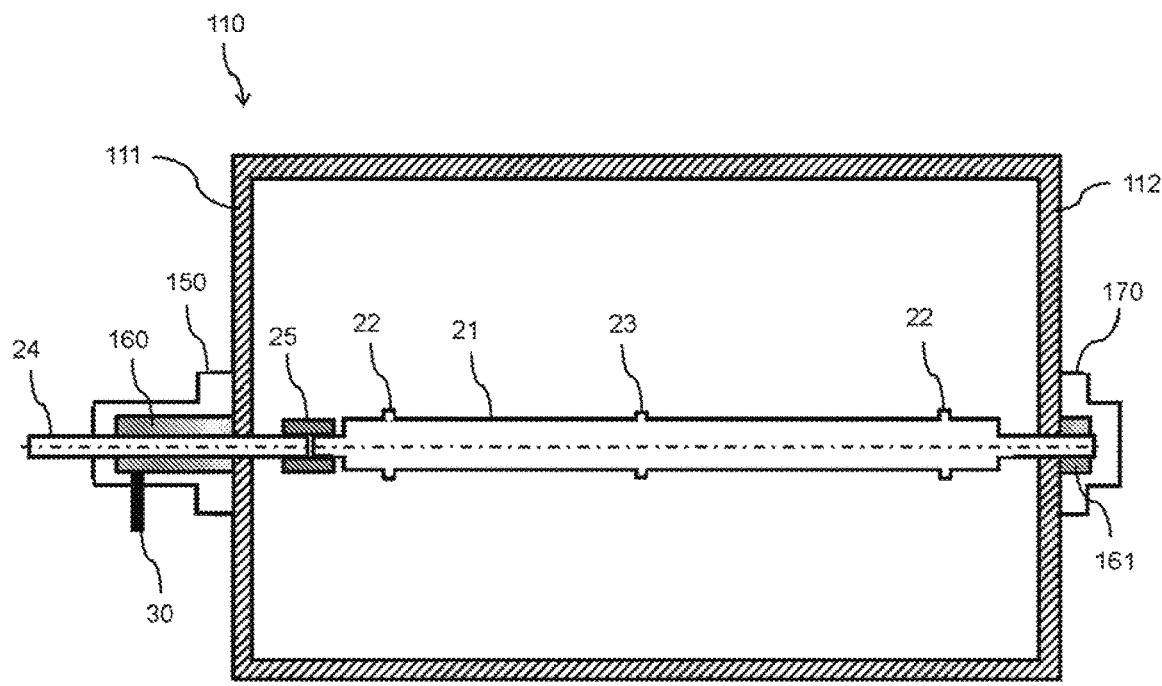

FIG. 6 schematically shows a rotating shaft and a first example of the load-converting element arranged within a bearing of the first embodiment of the apparatus.

FIG. 1 shows a first embodiment of the method of the invention. In a first step S110, a load-converting element, e.g. a piezoelectric element or a strain gauge, is provided adjacent to a rotating shaft arranged within a closed chamber and used at least for supporting a substrate during movement within and/or through the chamber. The rotating shaft may be actively rotated, i.e. driven, by a motor or any other means for driving and may thus be an active part in moving the substrate or may be passively rotated, i.e. by the movement of the substrate over the rotating shaft. In a second step S120, a first output signal of the load-converting element is measured while no substrate is present on the rotating shaft, i.e. the first output signal is an idle signal having a first value. During movement of a substrate within or through the closed chamber, the output signal of the load-converting element is monitored (step S130) and the presence of the substrate on the rotating shaft is detected when the output signal differs from the first output signal by a predetermined amount (step S140). Thus, if the presence is detected for the first time, the substrate just reached the rotating shaft in its movement. If the presence is detected continuously, then the substrate moves with any part of its extension over the rotating shaft. And if the presence is not detected anymore, i.e. the output signal changes from a value differing from the first output signal by the predetermined amount back to the first output signal, then the substrate just left the rotating shaft. In this way, a position of the substrate within the closed chamber can be detected.

FIG. 2A shows a second embodiment of the method, wherein a damage or a loss of the substrate or a disturbance in the movement of the substrate may be detected. FIG. 2B schematically shows two characteristics of the output signal over time according to the second embodiment and helps to explain the second embodiment. Steps S210 and S220 are identical with steps S110 and S120 of FIG. 1. The value of the first output signal measured in step S220 is denoted by $S_1$ in FIG. 2B. In step S230, a first point of time at which a substrate should be present on the rotating shaft is extrapolated on the basis of a known position of the substrate at a given time point and characteristics of a moving system moving the substrate from the known position to the rotating shaft, in particular the velocity of movement. The first point of time is denoted by $t_{11}$ in FIG. 2A. Then, the output signal of the load-converting element is monitored (step S240). If the presence of the substrate is not detected at the first point of time $t_{11}$, then it is concluded that the substrate is damaged, i.e. the front edge of the substrate is broken, or the substrate is lost, i.e. fallen from the moving system, or that the movement of the substrate is in any way disturbed, e.g. because a failure of the moving system occurred. In first exemplary characteristics of the monitored output signal over time, denoted by the continuous line in FIG. 2B, the output signal reaches a second value $S_2$, which differs from the first output signal $S_1$ by the predetermined amount and therefore indicates the presence of the substrate on the rotating shaft, occurs at a second point of time $t_{12}$ which differs from the first point of time. In this case, it can be concluded that the substrate is damaged at its front edge or that the moving system is retarded. In second exemplary characteristics of the monitored output signal over time, denoted by the broken line in FIG. 2B, the output signal never reaches the second value $S_2$, but instead remains at value $S_1$. In this case, it can be concluded that the substrate is lost in any way or that the moving system completely failed. As it is apparent, it is not always possible to make a precise statement what happed.

FIG. 3A shows a third embodiment of the method, wherein a damage of the substrate may be detected and may be determined in a more detailed way then in the second embodiment. FIGS. 3B to 3D each schematically show characteristics of the output signal of the load-converting element over time and a plan view on a substrate 10 and a rotating shaft 20 for different kinds of damages of the substrate 10. Step S310 is identical to step S110 in FIG. 1. In step S320, not only the first output signal $S_1$ is measured as described with respect to step S120 of FIG. 1, but also first characteristics of the output signal is obtained while a calibration substrate is moved over the rotating shaft. These first characteristics are denoted by the broken line in FIGS.

3B to 3D, wherein this line is only visible where it differs from second characteristics of the output signal obtained by monitoring the output signal while a "real" substrate is moved over the rotating shaft. Exemplary second characteristics are denoted by the continuous line in FIGS. 3B to 3D and the dot-and-dashed line in FIG. 3D. The calibration substrate is a substrate for which dimensions, weight and intactness, i.e. the absence of any damage, is known. The "real" substrate is a substrate which normally should be identical to the calibration substrate, but which may be damaged or which dimensions or weight may differ from that of the calibration substrate. Each characteristics of the output signal for a substrate is characterized by a first gradient corresponding to the arrival of the substrate at the rotating shaft, a maximum value $S_3$ and a second gradient corresponding to the leaving of the substrate from the rotating shaft. The first gradient is calculated as the quotient of the difference between the maximum value $S_3$ and the first output signal $S_1$ and a first period of time between a third point of time $t_{21}$ and a fourth point of time $t_{22}$. The output signal changes from the first output signal $S_1$ to the maximum value $S_3$ in the first period of time. The second gradient is calculated as the quotient of the difference between the first output signal $S_1$ and the maximum value $S_3$ and a second period of time between a fifth point of time $t_{23}$ and a sixth point of time $t_{24}$. The output signal changes from the maximum value $S_3$ to the first output signal $S_1$ in the second period of time. For a rectangular, undamaged substrate, the output signal equals the maximum value $S_3$ for the most time while the substrate is present on the rotating shaft, i.e. moves over the rotating shaft. This is shown in the exemplary characteristics of FIGS. 3B to 3D.

In step S330, second characteristics of the output signal are obtained by monitoring the output signal while a "real" and potentially damaged substrate moves over the rotating shaft. In step S340, the features of the second characteristics are compared to respective features of the first characteristics and specific damages of the substrate are detected when the features differ from each other as explained below.

FIG. 3B shows a plan view on a substrate 10 and a rotating shaft 20, wherein the substrate 10 is damaged at its front edge 11. That is, a region 11' adjoining the front edge 11 is broken off and is therefore called a broken region. The front edge 11 is that edge of the substrate 10 which first arrives at the rotating shaft 20 when the substrate 10 moves in the direction indicated by the arrow. A load-converting element 30 is arranged adjacent to the rotating shaft 20 and measures a load acting on the rotating shaft 20. The broken region 11' causes a slower increase of the measured output signal, i.e. a smaller first gradient of the second characteristics compared to the first gradient of the first characteristics. Thus, the maximum value $S_3$ is reached at a delayed fourth point of time $t'_{22}$, wherein the first period of time between the third point of time $t_{21}$ and the delayed fourth point of time $t'_{22}$ for the second characteristics is larger than the first period of time between the third point of time $t_{21}$ and the fourth point of time $t_{22}$ of the first characteristics. The other features of the second characteristics may be the same as for the first characteristics.

FIG. 3C shows a plan view on a substrate 10 and a rotating shaft 20, wherein the substrate 10 is damaged at its back edge 12. That is, a region 12' adjoining the back edge 12 is broken off and is therefore called a broken region. The back edge 12 is that edge of the substrate 10 which last leaves the rotating shaft 20 when the substrate 10 moves in the direction indicated by the arrow. The broken region 12' causes a slower decrease of the measured output signal, i.e. a smaller second gradient of the second characteristics compared to the first gradient of the first characteristics. Thus, the output signal begins to decrease from the maximum value $S_3$ at a preponed fifth point of time $t'_{23}$, wherein the second period of time between the preponed fifth point of time $t'_{23}$ and the sixth point of time $t_{24}$ for the second characteristics is larger than the second period of time between the fourth point of time $t_{23}$ and the sixth point of time $t_{24}$ of the first characteristics. The other features of the second characteristics may be the same as for the first characteristics.

The third to sixth points of time $t_{21}$ to $t_{24}$ as well as the delayed fourth point of time $t'_{22}$ and the preponed fifth point of time $t'_{23}$ are only relative measures of the time and do not express the absolute point of time at which the respective output signals are measured.

FIG. 3D shows a plan view on a substrate 10 and a rotating shaft 20, wherein the substrate 10 is damaged at a side edge 13 or at a first surface 14. That is, a region 13' adjoining the side edge 13 is broken off and is therefore called a broken region. The side edge 13 is that edge of the substrate 10 which extends along the direction into which the substrate 10 moves (indicated by the arrow). A laterally limited region 14' being part of the first surface 14 is damaged and therefore called a damaged surface region. The first surface 14 is a plane surface of the substrate 10, i.e. the lower surface which contacts the rotating shaft 20 or the upper surface which lies opposite to lower surface. The broken region 13' or the damaged surface region 14' causes a decrease of the measured output signal from the maximum value $S_3$ to a timely limited decreased value $S_{31}$, i.e. the output signal is lower than the maximum value $S_3$ for a limited period of time as shown in the continuous second characteristics of the output signal over time. If, however, the whole first surface 14 is damaged, i.e. the damaged region is not laterally limited, the maximum value $S_3$ of the first characteristics is not reached at all for the second characteristics as shown in the exemplary characteristics indicated by the dot-and-dashed line. That is, the output signal of the second characteristics reaches only a decreased maximum value $S_{32}$ smaller than the maximum value $S_3$. Such damage may, for instance, be a thickness of a layer deposited on the substrate 10, wherein the thickness is smaller than a thickness of the respective layer of the calibration substrate. Therefore, a weight of the substrate 10 is smaller than a weight of the calibration substrate. The other features of the second characteristics may be the same as for the first characteristics.

Of course, some of the damages explained above may occur simultaneously resulting in a combination or overlapping of the described changes in the features of the output signal characteristics.

Further, it is clear for a person skilled in the art that the concrete course of the first and second characteristics depends on the kind of the electric parameter to which the load is converted by the load-converting element and on the kind of the output signal corresponding to the electric parameter and measured and monitored. Thus, the output signal may also decrease if a substrate is present on the rotating shaft compared to the first output signal when no substrate is present. In other word: The first and second characteristics may also run in opposite way and the maximum value of the output signal explained above may instead also be a minimum value of the output signal.

FIG. 4A shows a fourth embodiment of the method, wherein a dimension of the substrate may be detected using a plurality of load-converting elements. FIG. 4B schematically shows values of the output signal of the different load-converting elements at a given point of time and a plan view on a substrate 10 and a plurality of rotating shafts 20a to 20f at this given point of time. In a first step S410, a plurality of load-converting elements 30a to 30f is provided, wherein each individual load-converting element 30a to 30f is arranged adjacent to one of the plurality of rotating shafts 20a to 20f. That is, some or all of the rotating shafts forming a part of a transport system within the closed chamber are provided with one of the load-converting elements, wherein in the shown example each rotating shaft 20a to 20f is provided with one load-converting element 30a to 30f. In a second step S420, a first output signal $S_1$ of each of the load-converting elements 30a to 30f is measured while no substrate is present on the respective rotating shaft 20a to 20f, similar to step S120 of FIG. 1. During movement of a substrate 10 over the rotating shafts 20a to 20f, the output signals of the load-converting elements are monitored (step S430) and the presence of the substrate on an individual one of the rotating shafts 20a to 20f is detected when the respective output signal differs from the first output signal $S_1$ by a predetermined amount (step S440), for instance, when the respective output signal equals or is larger than a second value $S_2$. By way of example, output signals of the load-converting elements 30b to 30d are larger than the second value $S_2$, since the substrate 10 is present on the respective rotating shafts 20b to 20d. In contrast, output signals of the load-converting elements 30a, 30e and 30f equal the respective output signal $S_1$, since the substrate 10 is not present on the respective rotating shafts 20a, 20e and 20f. As indicated in FIG. 4B, the output signals of the different load-converting elements 30b to 30d may differ from each other due to differences in the load-converting elements and in their load conversion itself or due to differences in the load acting on them, i.e. the weight of the substrate portion lying on the respective rotating shaft 20b to 20d. In the same way, also the values of the first output signals $S_1$ may differ for the different rotating shafts 20a to 20f. From a known distance $L_{201}$ between the rotating shafts for which the output signals equal the first output signals $S_1$ and which are neighbouring ones to the rotating shafts for which the output signals equal or are larger than the second value $S_2$, e.g. 20a and 20e in FIG. 4B, and a known extension $L_{202}$ of a line covering the rotating shafts for which the output signals equal or are larger than the second value $S_2$, e.g. 20b to 20d in FIG. 4B, the length $L_{10}$ of the substrate 10 may be determined. The length $L_{10}$ may at least be limited to a range of values larger than the extension $L_{202}$ and smaller than the distance $L_{201}$. By evaluating the maximum values of the output signals, also a width of the substrate 10 may be determined. The length $L_{10}$ of the substrate is that extension of the substrate extending along the direction of movement (indicated by the arrow), whereas the width of the substrate is that extension of the substrate being orthogonal to the length $L_{10}$ and extending along the direction of the rotational axes of the rotating shafts 20a to 20f.

FIG. 5 schematically shows a first embodiment of the apparatus according to the invention. An apparatus 100 comprises a closed chamber 110 and two adjacent chambers 120 and 130, which are connected with the closed chamber 110 by gates 140. In the closed chamber 110, a plurality of rotating shafts 20a to 20e are arranged which together with rotating shafts 20 arranged in the adjacent chambers 120 and 130 form a transport system for moving a substrate through the chambers along a transport direction (indicated by the arrow). At least one load-converting element is provided adjacent to at least one of the rotating shafts 20a to 20e in the closed chamber 110. As shown by example in FIG. 5, two load-converting elements 30a and 30b are provided adjacent to the rotating shafts 20b and 20d. Each load-converting element 30a, 30b is connected with a measuring device 40a, 40b, respectively, which is suited to measure an output signal of the respective load-converting element 30a, 30b. Of course, some or all output signals may be measured by a common measuring device it this is applicable. The measured output signals are transmitted to a control device 50 which is suited for monitoring and evaluating the output signals. To this end, values or characteristics of output signals as well as reference values may be stored in a memory unit which may be arranged within the control device or outside the control device. The control device comprises comparing means and may comprise calculating means or other means suited for evaluating the output signals. Based on the evaluation, the control device determines a presence of a substrate on an individual one of the rotating shafts 20b or 20d provided with load-converting elements 30a, 30b or a damage, weight or dimension of a substrate as exemplarily described with respect to FIGS. 2A to 4B.

At least one of the rotating shafts 20 and 20a to 20e is connected with a driving device, wherein in the embodiment of FIG. 5 each rotating shaft which is not provided with a load-converting element, i.e. rotating shafts 20 in chambers 120 and 130 and rotating shafts 20a, 20c and 20e in the closed chamber 110, is connected with an individual driving device 60. However, also rotating shafts provided with a load-converting element may be connected with a driving device. These rotating shafts are called driven shafts in the following. Some or all driven shafts may also be connected to a common driving device. The driven shafts allow for moving a substrate through the chambers 110, 120 and 130. The driving devices 60 may be connected with the control device 50 such that the control device 50 may control the driving devices 60 and thus the movement, in particular the velocity, of a substrate through the chambers 110, 120 and 130.

FIG. 6 schematically shows a rotating shaft and a first example of the load-converting element according to the invention in a cross-section along the rotational axis of the rotating shaft. The rotating shaft comprises different parts: a substrate shaft 21 arranged within the closed chamber 110, a driving shaft 24 feeding through a first side wall 111 of the closed chamber 110 and suited to be connected with a driving device, and a shaft coupling 25 coupling the substrate shaft 21 and the driving shaft 24 together such that a rotation of the driving shaft 24 is transmitted to the substrate shaft 21 and vice versa. On the substrate shaft 21, two outer castors 22 and one inner castor 23 are arranged, wherein the castors 22 and 23 are strongly fixed to the substrate shaft 21 and move together with the substrate shaft 21. They may be integrally formed with the substrate shaft 21, i.e. they may be projections of the substrate shaft. A substrate lies only or mostly upon these castors 22 and 23, wherein the outer castors 22 serve for guiding side edges of the substrate in order to secure the direction of movement of the substrate. The substrate shaft 21 feeds with one end through a second side wall 112 of the closed chamber 110, the second side wall 112 lying opposite to the first side wall 111. The other end of the substrate shaft 21 ends in the shaft coupling 25, where also one end of the driving shaft 24 is situated. The driving shaft 24 feeds through the first side wall 111 and is hold by a first bearing 160 which is arranged within a feedthrough 150. The feedthrough 150 is a vacuum feedthrough if the closed chamber 110 is a vacuum chamber. The one end of the substrate shaft 21 is hold by a second bearing 161 which is closed to the environment by a blind flange 170. The first and the second bearings 160, 161 may be any bearing suited for supporting the respective part of the rotating shaft without affecting the environmental conditions within the closed chamber 110, in particular vacuum conditions. For instance, the bearings may be ball bearings. In one embodiment, the bearings 160, 161 are provided on the outside of the respective side walls 111 or 112 of the closed chamber, i.e. on the atmospheric side. Adjacent to the first bearing 160, the load-converting element 30 is provided, which therefore may convert load acting on the substrate shaft 21, transmitted by the shaft coupling 25 to the driving shaft 24 and to the first bearing 160. Thus, the load-converting element 30 is provided outside the closed chamber 110 and therefore outside a processing atmosphere, which is advantageous since the load-converting element 30 is protected from unfavorable ambient conditions like vapors, electromagnetic fields or high temperatures within the chamber 110. However, the load-converting element may be arranged at any point, where a load causes a deformation which may be converted into an electric parameter.

The materials of the rotating shaft 20, in particular of the substrate shaft 21, the shaft coupling 25 and the driving shaft 24, of the load-converting element 30 and, if applicable, of the bearings 160, 161 and the feedthrough 150 depend on the conditions connected with the processing of a substrate in the chamber 110 and on the position of the load-converting element 30 with respect to the chamber 110. The rotating shaft 20, the bearings 160, 161 as well as the feedthrough 150 may be formed of stainless steel. For high process temperatures within the chamber 110, the rotating shaft 20 may preferably made of ceramic. If the load-converting element 30 is a piezoelectric element, different materials, like $SiO_2$, $GaPO_4$, $La_3Ga_5SiO_{14}$, polyvinylidenflouride (PVDF), are known to a person skilled in the art. Furthermore, different load-converting elements with different temporal resolutions (ranging from quasistatic (0.001 Hz) to highdynamic (GHz)) and with different power resolution (ranging from $10^{-8}$ $N/cm^2$ to $10^5$ $N/cm^2$ are available. Moreover, different kinds of surface adapters, like balls or concave formed top pieces, to provide the transmittance of the load from the rotating shaft or the bearing onto a piezoelectric element are known. A substrate shaft may have a length (extension along the rotation axis) of around 450 mm and a diameter of around 45 mm. If it is made of ceramic, it may for instance have a weight of around 1.35 kg, wherein the weight of a rotating shaft made of stainless steel may be around 5.4 kg. A driving shaft may be shorter in length (e.g. 150 mm) and smaller in diameter e.g. 12 mm) resulting in a lighter weight. A substrate with a plan surface area of (30×50) $cm^2$ may have a weight of around 1.2 kg, whereas a substrate having a plan surface are of (60×120) $cm^2$ may have a weight of around 5.76 kg.

The embodiments of the invention described in the foregoing description are examples given by way of illustration and the invention is nowise limited thereto. Any modification, variation and equivalent arrangement as well as combinations of embodiments should be considered as being included within the scope of the invention.

REFERENCE NUMERALS

10 Substrate
11 Front edge
11' Broken region of the front edge
12 Back edge
12' Broken region of the back edge
13 Side edge
13' Broken region of the side edge
14 First surface
20, 20a-20f Rotating shaft
21 Substrate shaft
22 Outer castor
23 Inner castor
24 Driving shaft
25 Shaft coupling
30a-30f Load-converting element
40a, 40b Measuring device
50 Control device
60 Driving device
100 apparatus
110 Closed chamber
111 First side wall of the closed chamber
112 Second side wall of the closed chamber
120, 130 Adjacent chamber
140 Gate
150 Feedthrough
160 First bearing
161 Second bearing
170 Blind flange
$L_{10}$ Length of the substrate
$L_{201}$ Distance between rotating shafts
$L_{202}$ Extension of rotating shafts
$S_1$ First output signal
$S_2$ Second value of output signal
$S_3$ Maximum value of output signal
$S_{31}$ Timely limited decreased value of the output signal
$S_{32}$ Decreased maximum value of the output signal
$t_{11}$ First point of time
$t_{12}$ Second point of time
$t_{21}$ Third point of time
$t_{22}$ Fourth point of time
$t'_{22}$ Delayed fourth point of time
$t_{23}$ Fifth point of time
$t'_{23}$ Preponed firth point of time
$t_{24}$ Sixth point of time

The invention claimed is:

1. A method for determining the position of a substrate within a closed chamber, wherein the substrate is moved within the chamber by a transport system comprising at least one rotating shaft, the method comprising the steps of:
providing a load-converting element adjacent to at least one of the rotating shafts, wherein the load-converting element is suited for detecting a load acting on the at least one rotating shaft and for converting it into an electrical parameter corresponding to the load,
measuring a first output signal corresponding to a first value of the electrical parameter of the load-converting element while no substrate is present on the at least one rotating shaft,
monitoring the output signal corresponding to the value of the electrical parameter of the load-converting element,
detecting a presence of the substrate on the at least one rotating shaft when the output signal of the load-converting element differs from the first output signal by at least a predetermined amount,
obtaining first characteristics of the output signal for calibration by monitoring the output signal while a known calibration substrate completely moves over the rotating shaft, wherein the first characteristics contain a first gradient corresponding to the arrival of the calibration substrate at the rotating shaft, a second gradient corresponding to the leaving of the substrate and a maximum value, wherein the method further comprises at least one of the following steps:

detecting a damage of the substrate at its front edge if a first gradient of second characteristics of the output signal obtained by monitoring the output signal while the substrate completely moves over the rotating shaft differs from the first gradient of the first characteristics, detecting a damage of the substrate at its back edge if a second gradient of second characteristics of the output signal obtained by monitoring the output signal while the substrate completely moves over the rotating shaft differs from the second gradient of the first characteristics, detecting a damage of the substrate at a side edge or on a first surface if a maximum value of second characteristics of the output signal obtained by monitoring the output signal while the substrate completely moves over the rotating shaft is lower than the maximum value of the first characteristics, or determining a thickness of a layer deposited on the substrate within the chamber from a maximum value of second characteristics of the output signal obtained by monitoring the output signal while the substrate completely moves over the rotating shaft.

2. The method according to claim 1, wherein a damage or a loss of the substrate or a disturbance in the movement of the substrate is detected if a presence of the substrate is not detected at a first point of time, for which the presence of the substrate on the rotating shaft was predicted by extrapolation using a known position of the substrate and characteristics of a moving system which moves the substrate from the known position to the rotating shaft.

3. The method according to claim 1, wherein
a plurality of load-converting elements is provided adjacent to a plurality of rotating shafts, wherein each load-converting element is suited for detecting a load acting on one of the rotating shafts,
measuring an output signal of each load-converting element at one and the same point of time while a substrate is present on at least some of the rotating shafts, and
Determining a weight or dimensions of the substrate from the measured output signals.

4. The method according to claim 1, wherein the load-converting element is arranged within a radial bearing holding the rotating shaft and wherein a wear of the bearing is detected if the output signal shows a linear or superlinear drift over a time period including a large plurality of substrate passages over the rotating shaft.

5. The method according to claim 1, wherein the load-converting element is a piezoelectric element or a strain gauge.

6. The method according to claim 1, wherein the transport system comprises a plurality of rotating shafts and is suited for moving a substrate lying directly on the rotating shafts or wherein the transport system comprises a belt supported by the at least one rotating shaft and is suited for moving a substrate lying on the belt.

7. The method according to claim 1, wherein the closed chamber is a vacuum or an atmospheric chamber suited for providing a reactive, corrosive or misty atmosphere and/or suited to be heated to temperatures above 300° C., in particular above 500° C.

8. The method according to claim 1, wherein the closed chamber is a closed space sublimation chamber and a closed space sublimation process is performed while the substrate is situated within the closed chamber.

9. An apparatus for performing the method of claim 1, the apparatus comprising:
a closed chamber comprising a transport system having at least one rotating shaft and being suited for moving a substrate through and/or within the chamber,
a load-converting element arranged adjacent to at least one of the rotating shafts and suited for detecting a load acting on the at least one rotating shaft,
a measuring device for measuring an output signal of the load-converting element, and
a control device for monitoring and evaluating the output signal and detecting a presence of the substrate on the at least one rotating shaft when the output signal differs from a first output signal by a predetermined amount, the first output signal being measured while no substrate is present on the at least one rotating shaft.

10. The apparatus of claim 9, wherein the at least one rotating shaft is held by a radial bearing arranged within a chamber wall and wherein the load-converting element is arranged within the bearing.

11. The apparatus of claim 9, wherein a plurality of load-converting elements is arranged adjacent to a plurality of rotating shafts and the control device is suited for evaluating the output signals of all of the load-converting elements and for determining a weight or dimensions of the substrate being present on the rotating shafts.

12. The apparatus of claim 9, wherein the load-converting element is a piezoelectric element or a strain gauge.

13. The apparatus of claim 9, wherein the transport system comprises a plurality of rotating shafts and is suited for moving a substrate lying directly on the rotating shafts or wherein the transport system comprises a belt supported by the at least one rotating shaft and is suited for moving a substrate lying on the belt.

14. The apparatus of claim 9, wherein the closed chamber is a vacuum or an atmospheric chamber suited for providing a reactive, corrosive or misty atmosphere and/or suited to be heated to temperatures above 300° C., in particular above 500° C.

15. The apparatus of claim 9, wherein the closed chamber is a closed space sublimation chamber.

* * * * *